United States Patent
Qi et al.

(10) Patent No.: US 10,014,392 B2
(45) Date of Patent: Jul. 3, 2018

(54) LATERALLY DIFFUSED METAL-OXIDE-SEMICONDUCTOR FIELD-EFFECT TRANSISTOR

(71) Applicant: CSMC TECHNOLOGIES FAB2 CO., LTD., Wuxi New District (CN)

(72) Inventors: Shukun Qi, Wuxi New District (CN); Guangsheng Zhang, Wuxi New District (CN); Guipeng Sun, Wuxi New District (CN); Sen Zhang, Wuxi New District (CN)

(73) Assignee: CSMC TECHNOLOGIES FAB2 CO., LTD., Wuxi New District, Jiangsu (CN)

( * ) Notice: Subject to any disclaimer, the term of this patent is extended or adjusted under 35 U.S.C. 154(b) by 0 days.

(21) Appl. No.: 15/564,172

(22) PCT Filed: Jan. 29, 2016

(86) PCT No.: PCT/CN2016/072846
§ 371 (c)(1),
(2) Date: Oct. 3, 2017

(87) PCT Pub. No.: WO2016/161841
PCT Pub. Date: Oct. 13, 2016

(65) Prior Publication Data
US 2018/0122921 A1    May 3, 2018

(30) Foreign Application Priority Data
Apr. 10, 2015 (CN) .......................... 2015 1 0170810

(51) Int. Cl.
*H01L 29/06* (2006.01)
*H01L 29/66* (2006.01)
*H01L 29/78* (2006.01)

(52) U.S. Cl.
CPC ...... *H01L 29/66681* (2013.01); *H01L 29/063* (2013.01); *H01L 29/7816* (2013.01)

(58) Field of Classification Search
CPC ............... H01L 29/0623; H01L 29/063; H01L 29/0634; H01L 29/66681; H01L 29/7816
See application file for complete search history.

(56) References Cited

U.S. PATENT DOCUMENTS

2016/0240660 A1*  8/2016  Yue ..................... H01L 29/7816

FOREIGN PATENT DOCUMENTS

| CN | 101577291 A | 11/2009 |
|----|-------------|---------|
| CN | 102569382 A | 7/2012 |
| CN | 103745988 A | 4/2014 |

OTHER PUBLICATIONS

International Search Report and English Translation thereof for International Application No. PCT/CN2016/072846, dated May 9, 2016 (6 pages).

* cited by examiner

*Primary Examiner* — Hoai V Pham
(74) *Attorney, Agent, or Firm* — Kagan Binder, PLLC

(57) ABSTRACT

Provided is a laterally diffused metal-oxide-semiconductor field-effect transistor, comprising a substrate (110), a source (150), a drain (140), a body region (160), a P-type field-limiting ring (135), and a well region on the substrate (110); the well region comprises an inserted well (122), which has P-type doping and is disposed below the drain and connected to the drain; N wells (124) disposed at the two sides of the inserted well (122); a P well (126) disposed next to the N well (124) and connected to the N well (124); a P-type field-limiting ring (135), which is disposed inside the N well (124), is a closed ring-shaped structure, and is located at the periphery below the drain (140); the inserted well (122) extends in its longitudinal direction to the position where it (Continued)

is in contact with said P-type field-limiting ring (135); the source (150) and the body region (160) are disposed inside the P well (126).

7 Claims, 5 Drawing Sheets

LATERALLY DIFFUSED METAL-OXIDE-SEMICONDUCTOR FIELD-EFFECT TRANSISTOR

FIELD OF THE INVENTION

The present disclosure relates to semiconductors technology, and more particularly relates to a laterally diffused metal-oxide-semiconductor field-effect transistor having a RESURF structure.

BACKGROUND OF THE INVENTION

The basic structure using reduced surface field (RESURF) principle consists of a low-doped P-type substrate and a low-doped N-type epitaxial layer. A P well is formed on the epitaxial layer and N+, P+ are implanted into the P well, such that a transverse P-well/N-epi (P well/N-type epitaxial layer) junction and a longitudinal P-sub/N-epi (P-type substrate/N-type epitaxial layer) junction are formed. Due to a higher doping concentration at both ends of the transverse junction, the breakdown voltage of the transverse junction is lower than that of the longitudinal junction. The basic principle of RESURF is to enable the epitaxial layer to be completely depleted before the transverse junction reaches the critical avalanche breakdown field by using the interaction of the transverse junction and the longitudinal junction. By reasonably optimizing the device parameters, the breakdown of the device occurs in the longitudinal junction, thereby playing a role in reducing the surface field.

In an improved RESURF structure, a very low-doped N-type deep well is formed on the substrate or the epitaxy, such that a first RESURF is formed between the P-type substrate and the N-type deep well. Then, an implantation is performed in the N-type deep well and under the field oxide to form a P-type floating field limiting ring (FP), such that a second RESURF is formed between the FP and the deep well.

RESURF of such configuration satisfies certain requirements for high voltage, low on-resistance. However, the inventor found that in the tens of KHz to hundreds of KHz AC switch applications, the structure of the device may appear peak current, thus affecting the reliability of the device and the product, while the on-resistance cannot continue to be reduced.

SUMMARY OF THE INVENTION

Accordingly, it is necessary to provide a laterally diffused metal-oxide-semiconductor field-effect transistor, which can guarantee stability at a very high frequency.

A laterally diffused metal-oxide-semiconductor field-effect transistor includes a substrate, a source, a drain, a body region, and a well region located on the substrate. The well region includes: an inserting type well, P-type doped, wherein the inserting type well is disposed below the drain and is in contact with the drain and the substrate, a width of the inserting type well is less than a width of the drain; an N well disposed on a periphery of the inserting type well, the N well is in contact with both sides of the drain; and a P well disposed on a periphery of the N well and in contact with the N well. The laterally diffused metal-oxide-semiconductor field-effect transistor further includes a closed P-type field limiting ring, the P-type field limiting ring is disposed in the N well, and is located at a periphery of the drain and below the drain; the inserting type well extends along a longitudinal direction thereof and is in contact with the P-type field limiting ring, the source and the body region are disposed in the P well. In the aforementioned laterally diffused metal-oxide-semiconductor field-effect transistor, the P-type inserting type well extends outwardly over the drain and the N well below the drain, and is connected to the P-type field limiting ring in the drift region, such that the P-type field limiting ring is coupled to the potential of the substrate, thus the P-type field limiting ring is released from the floating state, and it is ensured that a stable junction capacitance can be maintained between the P-type field limiting ring and the N well under the AC high frequency switch state, which can help to improve the dynamic characteristics of the device to avoid the emergence of peak current. In addition, a triple RESURF structure is formed due to the provision of an inserting type well, which helps to increase the doping concentration of the N well and reduce the on-resistance of the device, and helps to improve the breakdown characteristics of the device.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following. Apparently, the accompanying drawings in the following description are only some embodiments of the present invention, and persons of ordinary skill in the art can derive other drawings from the accompanying drawings without creative efforts.

DETAILED DESCRIPTION OF THE EMBODIMENTS

Figure 1:
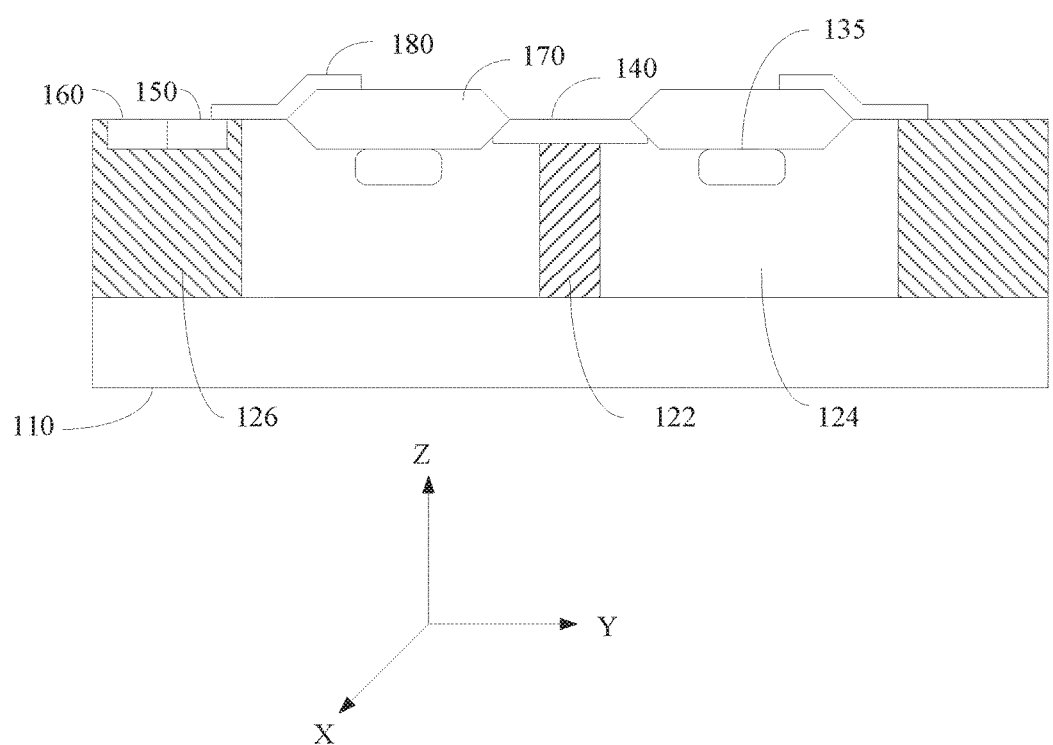
FIG. 1 is a schematic view of a laterally diffused metal-oxide-semiconductor field-effect transistor according to an embodiment.

Embodiments of the invention are described more fully hereinafter with reference to the accompanying drawings. The various embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art.

Unless otherwise defined, all terms (including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. The term "and/or" as used herein includes any and all combinations of one or more of the associated listed items.

After experiments and research, the inventors discovered that, the reason why the peak current occurs in a RESURF structure laterally diffused metal oxide semiconductor field effect transistor provided with P-type floating field limiting ring (FP) described in the background is that, there is no guarantee that a stable junction capacitance will be formed between the P-type floating field limiting ring and the N-type deep well in each switching cycle due to the floating FP, such that the minority carrier current of the reverse recovered is superimposed on the open current of the next cycle, thereby emerging peak current.

A laterally diffused metal-oxide-semiconductor field-effect transistor having a RESURF structure according to an embodiment includes a substrate, a source, a drain, a body region, a P-type field limiting ring, and a well region on the substrate. The well region specifically includes an N well, a P well, and an inserting type well inserted into the N well. The inserting type well has a doping type of P-type, which is disposed below the drain and is in contact with the drain and the substrate. The N well is disposed on a periphery of the inserting type well. A width of the inserting type well is less than a width of the drain, such that both sides of the drain may be in contact with the underlying N well. Since the inserting type well has a long strip shape, a width thereof refers to a side length of a short side and a length thereof refers to a side length of a long side. The well is disposed on a periphery of the N well and is in contact with the N well, and the source and the body region are disposed in the P well. The P-type field limiting ring is disposed in the N well, which is a closed ring structure. The closed ring structure refers to an end-to-end closed strip structure, which includes elliptical ring, circular ring, racetrack-shaped ring (i.e., runway shape of the track, both ends of the rectangular are each connected to a semicircle and then take the shape of an outer ring thereof), square ring and so on. The P-type field limiting ring is located at a periphery of the drain and below the drain, the drain is surrounded by the P-type field limiting ring. In other words, after the P-type field limiting ring and the N well are projected on a plane where the drain is located, the relationship on the plane between the drain, the N well, and the P-type field limiting ring is: the periphery of the drain is enclosed by the N well, a ring formed by the P-type field limiting ring surrounds the drain, and by which the N well is cut off on a surface of an active region. Since the device structure determines that the inserting type well cannot be in contact with the P-type field limiting ring in a width direction, the inserting type well extends in a longitudinal direction to a position in contact with the P-type field limiting ring.

FIG. 1 is a schematic view of a laterally diffused metal-oxide-semiconductor field-effect transistor (LDMOS) having a RESURF structure according to an embodiment, which is a left-right symmetric structure. The laterally diffused metal-oxide-semiconductor field-effect transistor having a RESURF structure includes a substrate 110, a well region on the substrate, a drain 140, a source 150, a body region 160, a field oxide region 170, a polysilicon structure 180, and a P-type field limiting ring 135. The substrate is P-type doped, the drain 140 is N-type doped, the source 150 is N-type doped, and the body region 160 is P-type doped. The well region includes a P-type doped inserting type well 122, an N well 124 serving as a drift region, and a P well 126 serving as a channel region. The field oxide region 170 is disposed on a surface of the N well 124, and the drain 140 is sandwiched by the two field oxide regions 170. The polysilicon structure 180 is composed of a polysilicon gate and a field portion, which is extended from a surface of the field oxide region 170 to a surface of the source 150.

Figure 2:
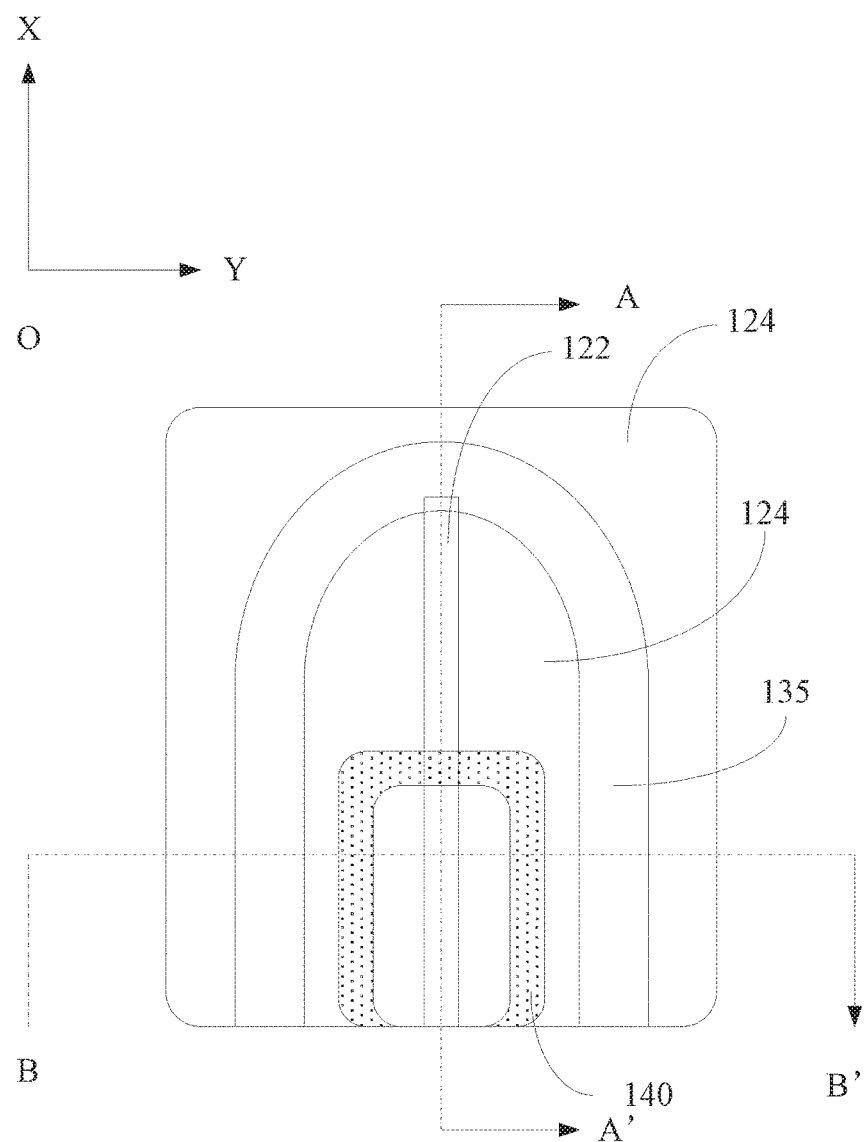
FIG. 2 is a top plan view of an active region of FIG. 1.
Figure 3:
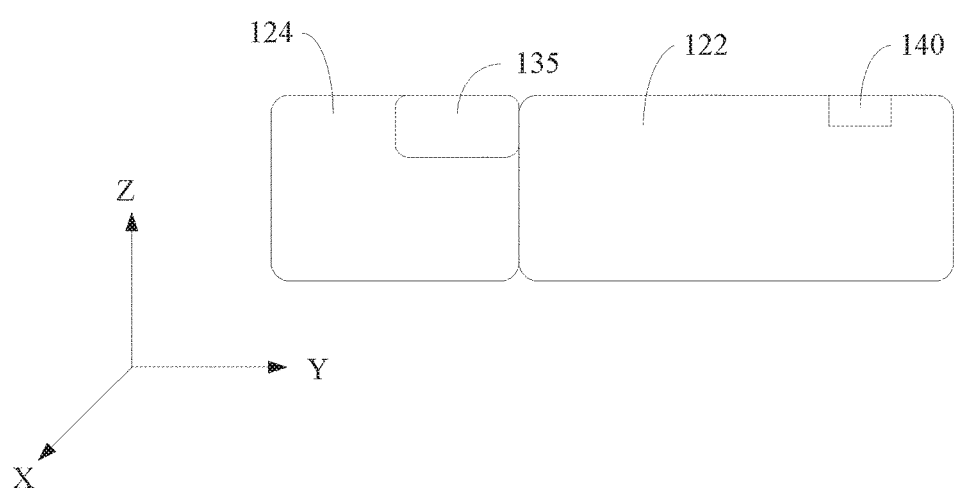
FIG. 3 is a cross-sectional view taken along line A-A' of FIG. 2.
Figure 4:
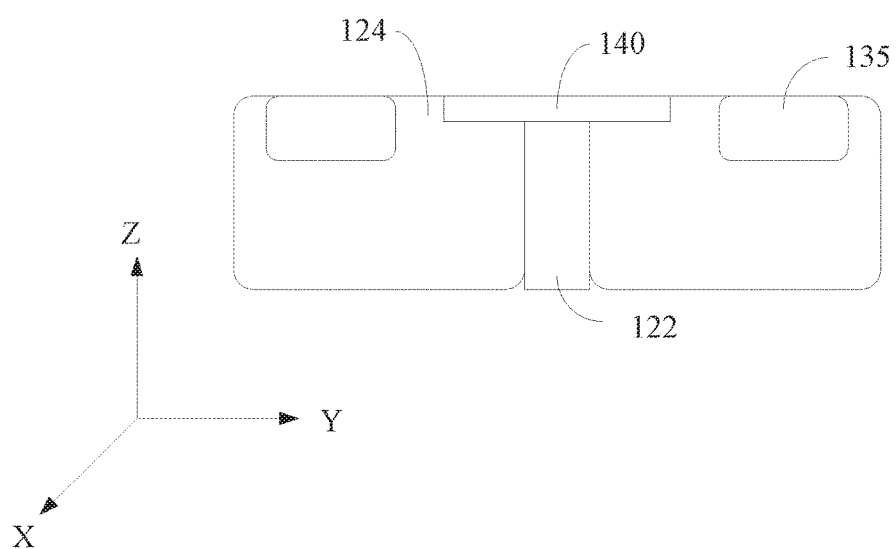
FIG. 4 is a cross-sectional view taken along line B-B' of FIG. 2.

Referring to FIG. 2 to FIG. 4, FIG. 2 is a top plan view of the active region of FIG. 1. FIG. 3 is a cross-sectional view taken along line A-A' of FIG. 2. FIG. 4 is a cross-sectional view taken along line of FIG. 2. As shown in FIG. 2, in the illustrated embodiment, the P-type field limiting ring 135 is a racetrack-shaped ring structure, the inserting type well 122 extends to a middle portion of an arc of the runway along a X-axis direction and is in contact with the P-type field limiting ring 135. The P-type field limiting ring 135 divides the N well 124 into a fingertip structure of an inner side of the ring and a square ring structure of an outer side of the ring on a surface of the active region. The drain 140 shown in FIG. 2 is a bonding pad portion lead by the drain, a middle portion thereof is shielded by the structure of the active region in FIG. 2.

In the aforementioned laterally diffused metal-oxide-semiconductor field-effect transistor having a RESURF structure, the P-type inserting type well 122 extends outwardly (i.e., in the X-axis direction) from below the drain 140 to beyond the drain 140 and the N well 124, and is connected to the P-type field limiting ring 135 in the drift region, such that the potential of the P-type field limiting ring 135 is the same as the potential of the substrate (Psub) (since the inserting type well 122 itself is in contact with the substrate 110, the potential of the substrate 110 is the same as that of the inserting type well 122), thus the P-type field limiting ring 135 is released from the floating state, and it is ensured that a stable junction capacitance can be maintained between the P-type field limiting ring 135 and the N well 124 under the AC high frequency switch state, which can help to improve the dynamic characteristics of the device to avoid the emergence of peak current.

As shown in FIG. 1, the inserting type well 122 is inserted into the N well 124 by splitting the N well 124 to a certain width below a drain terminal N+ junction, so as to form a triple RESURF structure, such that the inserting type well 122, the N well 124, the P well 126, and the substrate 110 are depleted from each other, and the breakdown point is transferred to the device body, thus the device can be longitudinally breakdown.

The width of the inserting type well 122 cannot be too wide, and it is necessary to ensure that the N-well 124 at both sides below the drain 140 are still in contact with the drain 140, such that a concentration of the N well 124 of the drift region can be improved compared with the prior art, which helps to the reduction of the on-resistance. This is because when an additional charge is added to the depletion region, the charge density of the opposite type will be increased correspondingly so as to meet the requirements of the charge balance.

The inserting type well 122 also cannot be too narrow The inserting type well 122 of a certain width can effectively control the order of the occurrence of the breakdown in the device body. If the width is too narrow, the inserting type well 122 has less influence on the depletion region of the N well 124 at both sides, and the breakdown position is close to the breakdown position when the N well 124 of the drift region is not provided with the inserting type well 122 in the prior art, such that the insertion of the inserting type well 122 is less effective for the adjustment of the breakdown.

When the drain 140 is externally coupled to a higher potential and depleted to the drain 140, the inserting type well 122 is depleted with the N well 124 of the drift region at both sides, until a depletion layer formed on the N-well 124 at both sides is gradually expanded to be overlapped in the well 126. The potential lines on both sides are coupled to each other, and then depleted to the substrate 110 from top to bottom, such that the electric field peak is weakened, thereby effectively improving the breakdown voltage.

In the illustrated embodiment shown in FIG. 1, the drain 140 is an N+ drain, the source 150 is an N+ source, and the body region 160 is a P+ region.

Figure 5:
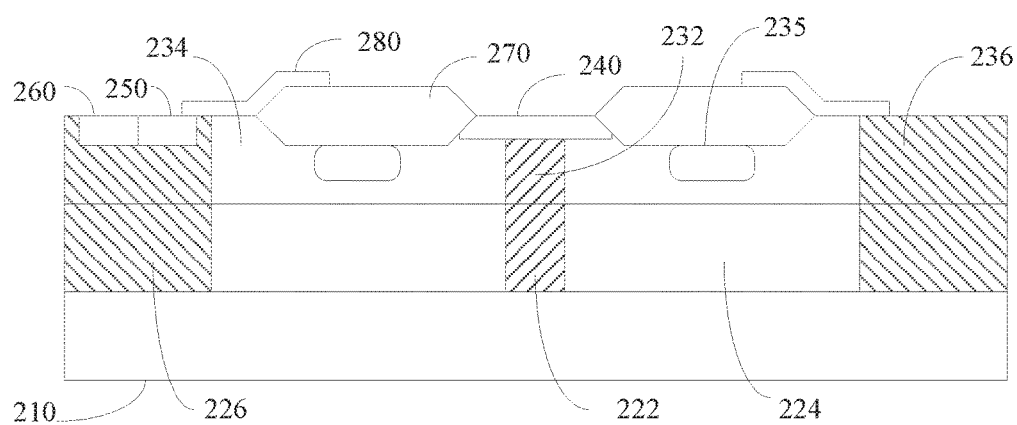
FIG. 5 is a schematic view of a laterally diffused metal-oxide-semiconductor field-effect transistor according to another embodiment.

FIG. 5 is a schematic view of a laterally diffused metal-oxide-semiconductor field-effect transistor having a RESURF structure according to another embodiment. The laterally diffused metal-oxide-semiconductor field-effect transistor of the illustrated embodiment is substantially the same as that of the embodiment shown in FIG. 1. The difference lies in that, the well region is composed of a high voltage well configured to cooperate with a high voltage device and a low voltage well configured to cooperate with a low voltage device. In other words, LDMOS includes a substrate 210, a first well region on the substrate and a second well region on the first well region, a drain 240, a source 250, a body region 260, a filed oxide region 270, a polysilicon structure 280, and a P-type field limiting ring 235. The first well region includes a P-type doped first inserting type well 222, a first N well 224, and a first P well 226. The second well region includes a P-type second inserting type well 232, a second N well 234, and a third P well 236. The second inserting type well 232, the second N well 234, and the third P well 236 are in contact with the first inserting type well 222, the first N well 224, and the first P well 226, respectively. The first N well 224 and the second N well 234 cooperatively serve as a drift region. The drain 250 and the body region 260 are disposed in the second P well 236.

In order to ensure that there is still a higher concentration of N-type impurities when the drift region is depleted to the active region (DTO) of the drain 240, it is necessary to ensure that an N+ between the N well (including the first N well 224 and the second N well 234) and the inserting type well (including the first inserting type well 222 and the second inserting type well 232) still has a certain effective width, at least 30% of the active region of the drain 240. Thus, widths of the first inserting type well 222 and the second inserting type well 232 should be less than or equal to 40% of a width of the active region of the drain 240. In an embodiment where the active region has a width of 10 µm, the aforementioned effective width is at least 3 µm, i.e., widths of the first inserting type well 222 and the second inserting type well 232 are less than or equal to 2 µm.

In the illustrated embodiment shown in FIG. 2, the drain 240 is an N+ drain, the source 250 is an N+ source, and the body region 260 is a P+ region.

Although the description is illustrated and described herein with reference to certain embodiments, the description is not intended to be limited to the details shown. Modifications may be made in the details within the scope and range equivalents of the claims.

What is claimed is:

1. A laterally diffused metal-oxide-semiconductor field-effect transistor, comprising: a substrate, a source, a drain, a body region, and a well region located on the substrate, wherein the well region comprises:

an inserting type well, P-type doped, wherein the inserting type well is disposed below the drain and is in contact with the drain and the substrate, a width of the inserting type well is less than a width of the drain;

an N well disposed on a periphery of the inserting type well, the N well being in contact with both sides of the drain; and a P well disposed on a periphery of the N well and in contact with the N well;

wherein the laterally diffused metal-oxide-semiconductor field-effect transistor further comprises a closed P-type field limiting ring, the P-type field limiting ring is disposed in the N well and is located at a periphery of the drain and below the drain; the inserting type well extends along a longitudinal direction thereof and is in contact with the P-type field limiting ring, the source and the body region are disposed in the P well.

2. The laterally diffused metal-oxide-semiconductor field-effect transistor according to claim 1, wherein the well region comprises a first well region located on the substrate and a second well region located on the first well region; the inserting type well comprises a first inserting type well located in the first well region and a second inserting type well located in the second well region; the N well comprises a first N well located in the first well region and a second N well located in the second well region; the P well comprises a first P well located in the first well region and a second P well located in the second well region.

3. The laterally diffused metal-oxide-semiconductor field-effect transistor according to claim 2, wherein a doping concentration of the first N well is lower than a doping concentration of the second N well, a doping concentration of the first P well is lower than a doping concentration of the second P well, a doping concentration of the first inserting type well is lower than a doping concentration of the second inserting type well.

4. The laterally diffused metal-oxide-semiconductor field-effect transistor according to claim 1, further comprising two field oxide regions and a polysilicon structure, wherein the two field oxide regions are disposed on a surface of the N well, and the drain is sandwiched by the two field oxide regions, the polysilicon structure extends from surfaces of the two field oxide regions to a surface of the source.

5. The laterally diffused metal-oxide-semiconductor field-effect transistor according to claim 1, wherein a width of the inserting type well is less than or equal to 40% of a width of an active region of the drain.

6. The laterally diffused metal-oxide-semiconductor field-effect transistor according to claim 1, wherein a doping concentration of the well region is lower than a doping concentration of the drain.

7. The laterally diffused metal-oxide-semiconductor field-effect transistor according to claim 1, wherein the substrate is a P-type doped substrate, the drain is an N-type doped drain, the source is an N-type doped source, and the body region is a P-type doped body region.

* * * * *